US010440685B2

(12) United States Patent
Zhu et al.

(10) Patent No.: US 10,440,685 B2
(45) Date of Patent: Oct. 8, 2019

(54) INTERLEAVING SEQUENTIAL DATA IN TIME AND FREQUENCY DOMAINS

(71) Applicant: Motorola Mobility LLC, Chicago, IL (US)

(72) Inventors: Chenxi Zhu, Fairfax, VA (US); Tyler Brown, Lake Zurich, IL (US)

(73) Assignee: Motorola Mobility LLC, Chicago, IL (US)

( * ) Notice: Subject to any disclaimer, the term of this patent is extended or adjusted under 35 U.S.C. 154(b) by 72 days.

(21) Appl. No.: 15/788,640

(22) Filed: Oct. 19, 2017

(65) Prior Publication Data

US 2018/0324762 A1 Nov. 8, 2018

Related U.S. Application Data

(60) Provisional application No. 62/501,893, filed on May 5, 2017.

(51) Int. Cl.
*H04W 72/04* (2009.01)
*H04L 1/00* (2006.01)
(Continued)

(52) U.S. Cl.
CPC ....... *H04W 72/04* (2013.01); *H03M 13/2721* (2013.01); *H04L 1/0071* (2013.01);
(Continued)

(58) Field of Classification Search
CPC ......... H04L 1/00; H04L 1/0071; H04L 5/007; H04L 5/0023; H04L 5/003;
(Continued)

(56) References Cited

U.S. PATENT DOCUMENTS 8,537,790 B2 * 9/2013 Cudak ................. H04L 5/0007
370/337
2005/0190817 A1 * 9/2005 Batra ..................... H04B 1/692
375/130
(Continued)

FOREIGN PATENT DOCUMENTS

CA 2394547 A1 6/2001
CN 2018028123 * 12/2016 ............. H04L 1/18

OTHER PUBLICATIONS

PCT/US2018/031195, "Notification of Transmittal of the International Search Report and the Written Opinion of the International Searching Authority, or the Declaration", International Searching Authority, dated Jul. 19, 2018, pp. 1-14.
(Continued)

*Primary Examiner* — Afsar M Qureshi
(74) *Attorney, Agent, or Firm* — Kunzler Bean & Adamson

(57) ABSTRACT

Apparatuses, methods, and systems for interleaving sequential data in time and frequency domains are disclosed. One apparatus includes a processor that interleaves sequential data in time and frequency domains. The sequential data includes a first data occupying a first time-frequency resource and a second data occupying a second time-frequency resource, the second data sequentially follows the first data prior to interleaving, and the first data is separated from the second data by at least one time resource and at least one frequency resource after interleaving.

17 Claims, 7 Drawing Sheets

(51) Int. Cl.
*H04L 5/00* (2006.01)
*H03M 13/27* (2006.01)
*H04J 99/00* (2009.01)
*H04L 27/26* (2006.01)

(52) U.S. Cl.
CPC ............ *H04L 5/0007* (2013.01); *H04J 15/00* (2013.01); *H04L 5/003* (2013.01); *H04L 5/0023* (2013.01); *H04L 27/2626* (2013.01); *H04L 27/2647* (2013.01)

(58) Field of Classification Search
CPC ........... H04L 27/2626; H04L 27/2647; H04W 72/04; H04W 72/0406; H04J 15/00; H03M 13/00
See application file for complete search history.

(56) References Cited

U.S. PATENT DOCUMENTS

| | | | | |
|---|---|---|---|---|
| 2008/0225965 | A1* | 9/2008 | Pi | H04L 1/0003 375/260 |
| 2012/0002740 | A1* | 1/2012 | Han | H04L 5/0048 375/260 |
| 2014/0247803 | A1* | 9/2014 | Arambepola | H04L 1/0071 370/330 |
| 2014/0336993 | A1* | 11/2014 | Grigori | G06F 17/12 703/2 |
| 2016/0087652 | A1* | 3/2016 | Ha | H03M 13/2757 714/755 |

OTHER PUBLICATIONS

Sony, "Considerations on Dynamic Resource Sharing for eMBB/URLLC in DL", 3GPP TSG RAN WG1 NR Ad-Hoc Meeting, R1-1700677, Jan. 16-20, 2017, pp. 1-8.
Lenovo, Motorola Mobility, "Discussion of codeword mapping", 3GPP TSG RAN WG1 Meeting #88bis, R1-1705649, Apr. 3-7, 2017, pp. 1-6.
Dongfeng Yuan, Xuemei Zhu, "Multiple Hierarchical Transmission Scheme with Bit Interleaver over Rayleigh Fading Channel", Department of Electrical Engineering, Shandong University, pp. 1-4, China.
LG Electronics, "On multiplexing between eMBB and URLLC", 3GPP TSG RAN WG1 Meeting #86bis, R1-1609236, Oct. 10-14, 2016, pp. 1-12.
LTE, "3rd Generation Partnership Project; Technical Specification Group Radio Access Network; Evolved Universal Terrestrial Radio Access (E-UTRA); Physical channels and modulation (Release 13)", 3GPP TS 36.211, Jun. 2016, pp. 1-170.
Qualcomm Incorporated, "CW to layer mapping and frequency domain interleaving", 3GPP TSG RAN WG1 #88bis, R1-1705574, Apr. 3-7, 2017, pp. 1-16.
Ericsson. "Codeword to layer mapping for DL and UL", 3GPP TSG-RAN WG1 #88bis, R1-1705883, Apr. 3-7, 2017, pp. 1-5.
ETSI, 5G; Study on Scenarios and Requirements for Next Generation Access Technologies (3GPP TR 38.913 version 14.2.0 Release 14), May 2017, pp. 1-41.

* cited by examiner

Codeword
200

FIG. 3

INTERLEAVING SEQUENTIAL DATA IN TIME AND FREQUENCY DOMAINS

CROSS-REFERENCES TO RELATED APPLICATIONS

This application claims the benefit of U.S. Provisional Patent Application No. 62/501,893 entitled MULTIDIMENSIONAL CODEWORD MAPPING TO RESOURCE ELEMENT and filed on May 5, 2017 for Chenxi Zhu et al., which is incorporated herein by reference in its entirety.

FIELD

The subject matter disclosed herein relates to generally to wireless communications and more particularly relates to interleaving sequential data in time and frequency domains.

BACKGROUND

Description of the Related Art

The following abbreviations are herewith defined, at least some of which are referred to within the following description: Third Generation Partnership Project ("3GPP"), Positive-Acknowledgment ("ACK"), Binary Phase Shift Keying ("BPSK"), Clear Channel Assessment ("CCA"), Cyclic Prefix ("CP"), Cyclical Redundancy Check ("CRC"), Channel State Information ("CSI"), Common Search Space ("CSS"), Discrete Fourier Transform Spread ("DFTS"), Downlink Control Information ("DCI"), Downlink ("DL"), Downlink Pilot Time Slot ("DwPTS"), Enhanced Clear Channel Assessment ("eCCA"), Enhanced Mobile Broadband ("eMBB"), Evolved Node B ("eNB"), European Telecommunications Standards Institute ("ETSI"), Frame Based Equipment ("FBE"), Frequency Division Duplex ("FDD"), Frequency Division Multiple Access ("FDMA"), Frequency Division Orthogonal Cover Code ("FD-OCC"), Guard Period ("GP"), Hybrid Automatic Repeat Request ("HARQ"), Internet-of-Things ("IoT"), Licensed Assisted Access ("LAA"), Load Based Equipment ("LBE"), Listen-Before-Talk ("LBT"), Long Term Evolution ("LTE"), Multiple Access ("MA"), Modulation Coding Scheme ("MCS"), Machine Type Communication ("MTC"), Multiple Input Multiple Output ("MIMO"), Multi User Shared Access ("MUSA"), Narrowband ("NB"), Negative-Acknowledgment ("NACK") or ("NAK"), Next Generation Node B ("gNB"), Non-Orthogonal Multiple Access ("NOMA"), Orthogonal Frequency Division Multiplexing ("OFDM"), Primary Cell ("PCell"), Physical Broadcast Channel ("PBCH"), Physical Downlink Control Channel ("PDCCH"), Physical Downlink Shared Channel ("PDSCH"), Pattern Division Multiple Access ("PDMA"), Physical Hybrid ARQ Indicator Channel ("PHICH"), Physical Random Access Channel ("PRACH"), Physical Resource Block ("PRB"), Physical Uplink Control Channel ("PUCCH"), Physical Uplink Shared Channel ("PUSCH"), Quality of Service ("QoS"), Quadrature Phase Shift Keying ("QPSK"), Radio Resource Control ("RRC"), Random Access Procedure ("RACH"), Random Access Response ("RAR"), Radio Link Failure ("RLF"), Radio Network Temporary Identifier ("RNTI"), Reference Signal ("RS"), Remaining Minimum System Information ("RMSI"), Resource Spread Multiple Access ("RSMA"), Reference Signal Received Power ("RSRP"), Round Trip Time ("RTT"), Receive ("RX"), Sparse Code Multiple Access ("SCMA"), Scheduling Request ("SR"), Single Carrier Frequency Division Multiple Access ("SC-FDMA"), Secondary Cell ("SCell"), Shared Channel ("SCH"), Signal-to-Interference-Plus-Noise Ratio ("SINR"), System Information Block ("SIB"), Synchronization Signal ("SS"), Transport Block ("TB"), Transport Block Size ("TBS"), Time-Division Duplex ("TDD"), Time Division Multiplex ("TDM"), Time Division Orthogonal Cover Code ("TD-OCC"), Transmission Time Interval ("TTI"), Transmit ("TX"), Uplink Control Information ("UCI"), User Entity/Equipment (Mobile Terminal) ("UE"), Uplink ("UL"), Universal Mobile Telecommunications System ("UMTS"), Uplink Pilot Time Slot ("UpPTS"), Ultra-reliability and Low-latency Communications ("URLLC"), and Worldwide Interoperability for Microwave Access ("WiMAX"). As used herein, "HARQ-ACK" may represent collectively the Positive Acknowledge ("ACK") and the Negative Acknowledge ("NACK"). ACK means that a TB is correctly received while NACK (or NAK) means a TB is erroneously received.

In certain wireless communications networks, a URLLC transmission may occur during an eMBB transmission. In such networks, the URLLC transmission may interfere with the eMBB transmission.

BRIEF SUMMARY

Apparatuses for interleaving sequential data in time and frequency domains are disclosed. Methods and systems also perform the functions of the apparatus. In one embodiment, the apparatus includes a processor that interleaves sequential data in time and frequency domains. In such embodiments, the sequential data includes a first data occupying a first time-frequency resource and a second data occupying a second time-frequency resource, the second data sequentially follows the first data prior to interleaving, and the first data is separated from the second data by at least one time resource and at least one frequency resource after interleaving.

In one embodiment, the apparatus includes a transmitter that transmits the sequential data that is interleaved in the time and frequency domains. In a further embodiment, adjacent sequential data before interleaving is separated by at least one time resource and at least one frequency resource after interleaving.

In certain embodiments, the sequential data is interleaved into a time frequency matrix by mapping the sequential data into a first predetermined number of rows and columns in a diagonal manner such that two adjacent elements on a diagonal carry sequential data, and two adjacent elements on a diagonal are separated by one time resource and one frequency resource. In various embodiments, a time domain interleaving vector used for permutating the sequential data in the time domain is formed by mapping time domain indexes into a second predetermined number of rows and columns in a row first manner to form a first mapping matrix and reading out the first mapping matrix in a column first manner.

In some embodiments, a frequency domain interleaving vector used for permutating the sequential data in the frequency domain is formed by mapping frequency domain indexes into a third predetermined number of rows and columns in a row first manner to form a second mapping matrix and reading out the second mapping matrix in a column first manner. In one embodiment, the processor forms a permutated matrix based on the time frequency matrix. In such embodiments, each location of the time frequency matrix is permutated in the time domain based on the time domain interleaving vector and in the frequency domain based on the frequency domain interleaving vector to result in a corresponding permutated location, and the sequential data in each location is moved to the corresponding permutated location to form the permutated matrix. In a further embodiment, the mapping of the sequential data includes a number of resources that are marked as not being available for data transmission. In certain embodiments, the permutated matrix is renumbered based on the number of resources that are marked as not being available for data transmission to form a layer matrix.

In various embodiments, each layer is populated with the sequential data based on the layer matrix such that an entire layer is populated before moving to a next layer. In some embodiments, each layer is populated with the sequential data based on the layer matrix such that a same time-frequency resource of each layer is populated before moving to a next time-frequency resource.

A method for interleaving sequential data in time and frequency domains, in one embodiment, includes interleaving sequential data in time and frequency domains. In such an embodiment, the sequential data includes a first data occupying a first time-frequency resource and a second data occupying a second time-frequency resource, the second data sequentially follows the first data prior to interleaving, and the first data is separated from the second data by at least one time resource and at least one frequency resource after interleaving.

Another apparatus for receiving interleaved sequential data includes a receiver that receives interleaved sequential data. In some embodiments, the apparatus includes a processor that demodulates, deinterleaves, and decodes the interleaved sequential data. In such embodiments, the interleaved sequential data is deinterleaved in time and frequency domains, the sequential data includes a first data occupying a first time-frequency resource and a second data occupying a second time-frequency resource, the second data sequentially follows the first data after deinterleaving, and the first data is separated from the second data by at least one time resource and at least one frequency resource before deinterleaving.

In one embodiment, adjacent sequential data after deinterleaving is separated by at least one time resource and at least one frequency resource before deinterleaving. In certain embodiments, the sequential data is interleaved into a time frequency matrix by mapping the sequential data into a first predetermined number of rows and columns in a diagonal manner such that two adjacent elements on a diagonal carry sequential data, and two adjacent elements on a diagonal are separated by one time resource and one frequency resource. In various embodiments, a time domain interleaving vector used for permutating the sequential data in the time domain is formed by mapping time domain indexes into a second predetermined number of rows and columns in a row first manner to form a first mapping matrix and reading out the first mapping matrix in a column first manner.

In some embodiments, a frequency domain interleaving vector used for permutating the sequential data in the frequency domain is formed by mapping frequency domain indexes into a third predetermined number of rows and columns in a row first manner to form a second mapping matrix and reading out the second mapping matrix in a column first manner. In one embodiment, a permutated matrix is formed based on the time frequency matrix. In such embodiments, each location of the time frequency matrix is permutated in the time domain based on the time domain interleaving vector and in the frequency domain based on the frequency domain interleaving vector to result in a corresponding permutated location, and the sequential data in each location is moved to the corresponding permutated location to form the permutated matrix. In a further embodiment, the mapping of the sequential data includes a number of resources that are marked as not being available for data transmission. In certain embodiments, the permutated matrix is renumbered based on the number of resources that are marked as not being available for data transmission to form a layer matrix.

In various embodiments, each layer is populated with the sequential data based on the layer matrix such that an entire layer is populated before moving to a next layer. In some embodiments, each layer is populated with the sequential data based on the layer matrix such that a same time-frequency resource of each layer is populated before moving to a next time-frequency resource.

A method for receiving interleaved sequential data, in one embodiment, includes receiving interleaved sequential data. In certain embodiments, the method includes demodulating, deinterleaving, and decoding the interleaved sequential data. In such an embodiment, the interleaved sequential data is deinterleaved in time and frequency domains, the sequential data includes a first data occupying a first time-frequency resource and a second data occupying a second time-frequency resource, the second data sequentially follows the first data after deinterleaving, and the first data is separated from the second data by at least one time resource and at least one frequency resource before deinterleaving.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which:

FIG. 3 is a schematic block diagram illustrating one embodiment of a codeword;

DETAILED DESCRIPTION

Figure 1:
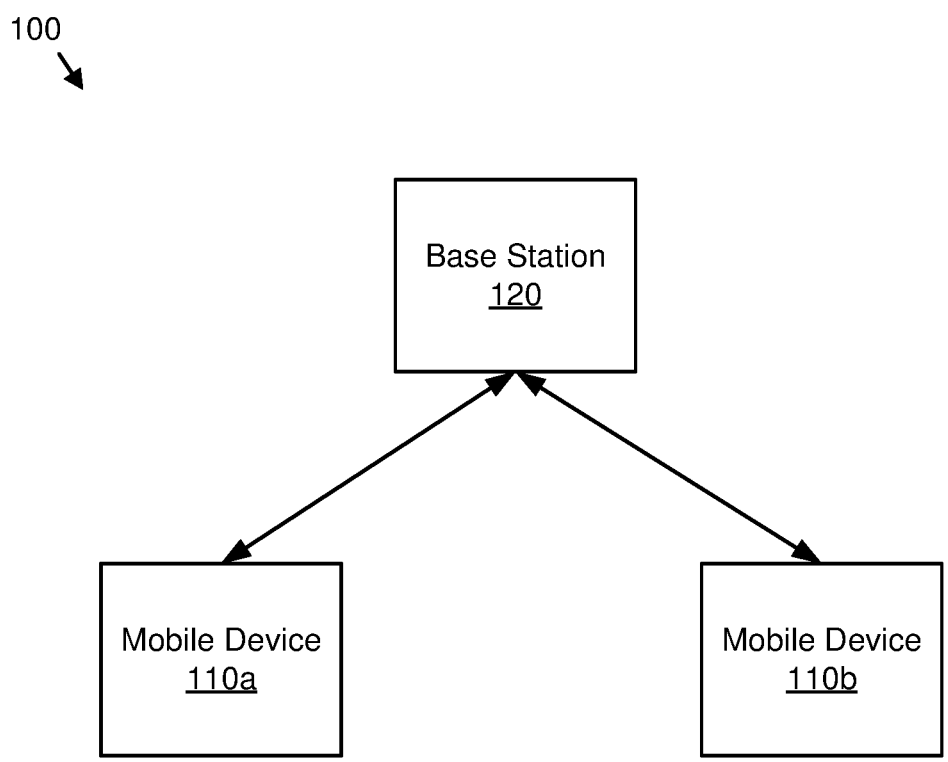
FIG. 1 is a schematic block diagram illustrating one embodiment of a communication system for interleaving sequential data in time and frequency domains.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom very-large-scale integration ("VLSI") circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory ("RAM"), a read-only memory ("ROM"), an erasable programmable read-only memory ("EPROM" or Flash memory), a portable compact disc read-only memory ("CD-ROM"), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be any number of lines and may be written in any combination of one or more programming languages including an object oriented programming language such as Python, Ruby, Java, Smalltalk, C++, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

FIG. 1 is a schematic block diagram illustrating one embodiment of a communication system 100 for interleaving sequential data in time and frequency domains. The system 100 includes a base station 120 and one or more mobile device 110. The mobile device 110 may communicate with the base station 120 on the cells of a cell groups associated with the base stations 120. The cell groups may be associated with a gNodeB ("gNB") base station 120, i.e. New Radio ("NR") base station 120, or an enhanced evolved node B ("eNB") Long Term Evolution ("LTE") base station 120. The mobile device 110 may be a mobile telephone, a machine-type communications ("MTC") device, a tablet computer, a laptop computer, and embedded communication devices in automobiles, kiosks, appliances, and the like.

In one embodiment, a receiving device may receive interleaved sequential data. In various embodiments, the receiving device may demodulate, deinterleave, and decode the interleaved sequential data. In such embodiments, the interleaved sequential data is deinterleaved in time and frequency domains, the sequential data includes a first data occupying a first time-frequency resource and a second data occupying a second time-frequency resource, the second data sequentially follows the first data after deinterleaving, and the first data is separated from the second data by at least one time resource and at least one frequency resource before deinterleaving. Accordingly, the receiving device may be used for receiving interleaved sequential data. The receiving device may be a mobile device 110 or a base station 120 depending on the receiving direction.

In one embodiment, a transmitting device may interleave sequential data in time and frequency domains. In such embodiments, the sequential data includes a first data occupying a first time-frequency resource and a second data occupying a second time-frequency resource, the second data sequentially follows the first data prior to interleaving, and the first data is separated from the second data by at least one time resource and at least one frequency resource after interleaving. Accordingly, the transmission device may be used for interleaving sequential data in time and frequency domains. The transmission device may be a mobile device 110 or a base station 120 depending on the transmission direction.

Figure 2:
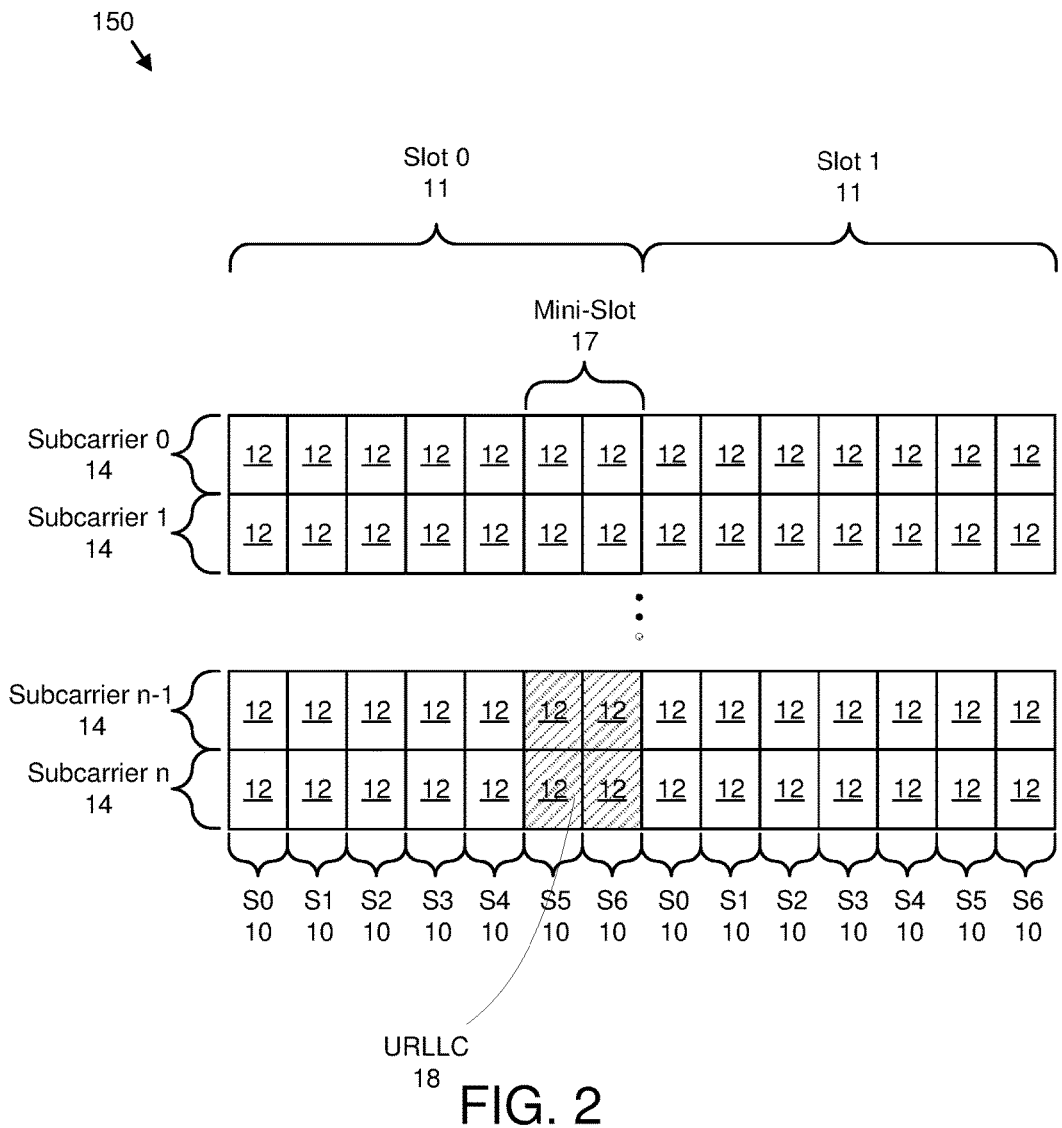
FIG. 2 is a schematic block diagram illustrating one embodiment of a transmission data.

FIG. 2 is a schematic block diagram illustrating one embodiment of transmission data 150. The transmission data 150 may carry communications between the base station 120 and the mobile device 110. In the depicted embodiment, the transmission data 150 includes one or more slots 11. Each slot 11 may include one or more Orthogonal Frequency-Division Multiplexing ("OFDM") symbols 10 in a time domain and one or more subcarrier frequencies 14 in a frequency domain. A plurality of subcarrier frequencies 14 may form a Physical Resource Block ("PRB"). A given OFDM symbol 10 at a given subcarrier frequency 14 defines a resource element 12. In one embodiment, a slot 11 may include one or more mini-slots 17.

In both Uplink ("UL") and Downlink ("DL") communications of a Fifth Generation ("5G") NR, an enhanced Mobile Broadband ("eMBB") transmission from a first mobile device 110a may suffer from an Ultra-Reliable Low Latency Communications ("URLLC") transmission 18 from a second mobile device 110b occupying a mini-slot 17. The interfering URLLC transmission 18 may be contained in smaller regions in the time and frequency resources, such as one or two OFDM symbols 10 and a smaller number of PRB than the eMBB transmission.

Because the URLLC transmission 18 in mini-slot 17 occupies a small number of consecutive OFDM symbols 10 in the time domain and a small number of PRBs in the frequency domain, the eMBB transmission suffers (e.g., either suffers strong interference or is punctured) only in these impacted resources. If these affected OFDM symbols 10 are used to transport many consecutive coded bits (e.g., or equivalently, modulation symbols) of a codeword, the decoder is expected to perform poorly, even if the coded bits in resources not impacted by interference are unaffected. If the affected coded bits are isolated and scattered more or less evenly, the decoder may have a good chance to decode the codeword successfully, or at least degrade gracefully according to the effective Signal-to-Interference-plus-Noise-Ratio ("SINR") of the codeword. Embodiments described herein may mitigate such interference by using a codeword to resource element 12 mapping scheme spanning time, frequency, and/or spatial domains (e.g., dimensions) that avoids undesirable configurations of consecutive punctured coded bits. For an eMBB transmission, adjacent codeword modulation symbols may be spread in time and frequency domains to inhibit being affected by the URLLC transmission 18. Two adjacent OFDM symbols 10 may be mapped to different OFDM symbols 10 and subcarriers 14 with a desired distance in each dimension.

Various embodiments described herein include two one-dimensional ("1D") interleavers, one in the time domain and the other in the frequency domain. These two 1D interleavers may be interwoven together through a diagonal pattern to form a two-dimensional ("2D") interleaver. The 2D interleaver may apply to a two-dimensional rectangular area covering the resource elements 12 allocated to a codeword. The embodiments work in a rectangular area (e.g., a matrix) as well as if resource elements 12 are not available for data transmissions such as if resource elements 12 are used for reference signals and control channels as described herein.

Figure 3:
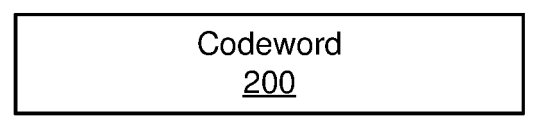

FIG. 3 is a schematic block diagram illustrating one embodiment of a codeword 200. The codeword 200 contains encoded data generated by an encoder for wireless transmission. The codeword 200 may include multiple elements.

Figure 4:
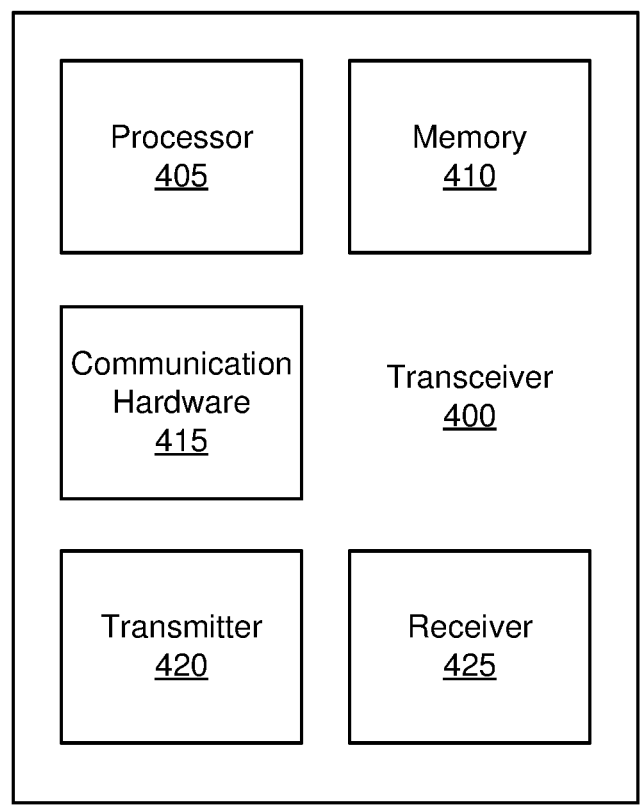
FIG. 4 is a schematic block diagram illustrating one embodiment of a transceiver for transmitting interleaved sequential data in time and frequency domains.

FIG. 4 is a schematic block diagram illustrating one embodiment of a transceiver 400 for transmitting interleaved sequential data in time and frequency domains. The transceiver 400 may be embodied in the mobile device 110. Alternatively, the transceiver 400 may be embodied in the base station 120. In the depicted embodiment, the transceiver 400 includes a processor 405, a memory 410, communication hardware 415, a transmitter 420, and a receiver 425. The memory 410 may be a semiconductor storage device, an optical storage device, micromechanical storage device, a magnetic storage device, or combinations thereof. The memory 410 may store code. The processor 405 may execute the code. The communication hardware 415 may direct data within the mobile device 110 and/or base station 120.

Figure 5:
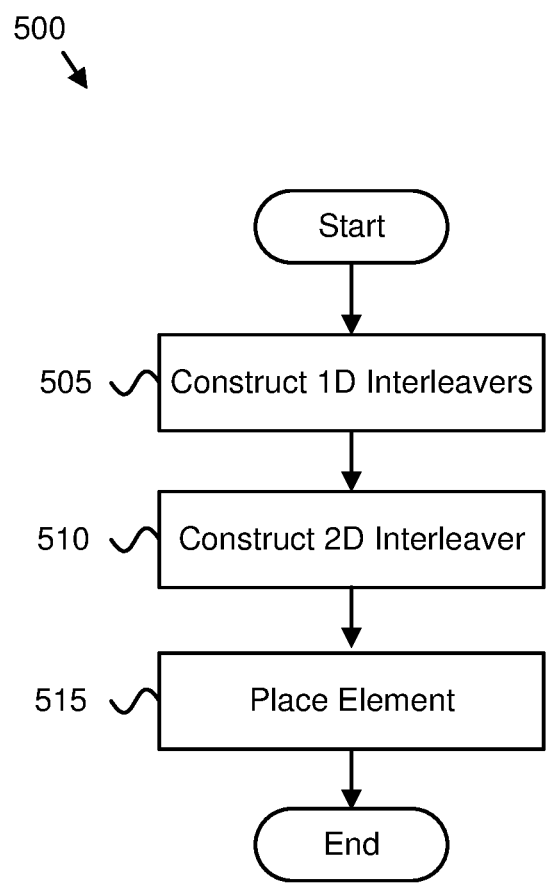
FIG. 5 is a schematic flow chart diagram illustrating one embodiment of a method for interleaving sequential data in time and frequency domains.

FIG. 5 is a schematic flow chart diagram illustrating one embodiment of a method 500 for interleaving sequential data in time and frequency domains. The method 500 may map the codeword 200 to one or more resource elements 12. The method 500 may be performed by the transceiver 400 and/or the processor 405.

The method 500 starts, and in one embodiment, the processor 405 constructs 505 the 1D interleavers. The 1D interleavers are of lengths M and N respectively, $V_{(M,M_d,M_w)}$ and $V_{(N,N_d,N_w)}$. In certain embodiments, the 1D interleavers are a permutation of L elements (e.g., from 0 to L−1) such that two consecutive codeword elements are mapped at some distance apart. This may be done by filling a generation matrix G of size $L_d*L_w$ ($L_d$ rows, $L_w$ columns) matrix with the consecutive integers from 0 to L−1, in a row-first manner (e.g., filling a row before moving onto the next row). $L_w>1$ may be a design parameter selected based on a design, and $L_d$ may be given by $L_d$=ceil (L/$L_w$), wherein ceil(x) is the smallest integer greater than x.

Below are example of matrices $G(L,L_d,L_w)$, where the matrix at the top corresponds to G(14, 4, 4), and the matrix at the bottom corresponds to G(12, 3, 4).

$$G(14, 4, 4) = \begin{bmatrix} 0 & 1 & 2 & 3 \\ 4 & 5 & 6 & 7 \\ 8 & 9 & 10 & 11 \\ 12 & 13 & - & - \end{bmatrix}$$

$$G(12, 4, 3) = \begin{bmatrix} 0 & 1 & 2 \\ 3 & 4 & 5 \\ 6 & 7 & 8 \\ 9 & 10 & 11 \end{bmatrix}$$

The above example matrices may be read out in a column first manner to obtain the following permutation vectors $V_{(L,L_d,L_w)}$. Specifically, the permutation vectors $V_{(14, 4, 4)}$ and $V_{(12, 4, 3)}$ correspond to G(14, 4, 4) and G(12, 4, 3):

$V_{(14,4,4)}$=[0 4 8 12 1 5 9 13 2 6 10 3 7 11]:

$V_{(12,4,3)}$=[0 3 6 9 1 4 7 10 2 5 8 11]

In various embodiments, the processor 405 further constructs 510 a 2D interleaver. The 2D interleaver may be an interleaving matrix P that may be constructed 510 as an M by N matrix as follows. The M*N matrix D(M*N,M,N) may be filled diagonally with numbers from 0 to M*N−1. In certain embodiments, two adjacent elements (e.g., such ask and k+1) are offset by (1,1), unless one is on an edge of the matrix and the other one is on another edge.

In one embodiment, the matrix is filled following the diagonals. In this embodiment, there are total M diagonals, each with length N, and the d+1$^{th}$ diagonal is right below the d$^{th}$ diagonal. When reaching the edge of the matrix, a diagonal wraps around and continues at the other end of the matrix. This can be represented by the modular operation Modular(x,N) and Modular (y,M).

A 12×14 matrix is provided as one example:

$$D = (168, 12, 14) =$$

$$\begin{bmatrix} 0 & 155 & 142 & 129 & 116 & 103 & 90 & 77 & 64 & 51 & 38 & 25 & 12 & 167 \\ 14 & 1 & 156 & 143 & 130 & 117 & 104 & 91 & 78 & 65 & 52 & 39 & 26 & 13 \\ 28 & 15 & 2 & 157 & 144 & 131 & 118 & 105 & 92 & 79 & 66 & 53 & 40 & 27 \\ 42 & 29 & 16 & 0 & 158 & 145 & 132 & 119 & 106 & 93 & 80 & 67 & 54 & 41 \\ 56 & 43 & 30 & 17 & 4 & 159 & 146 & 133 & 120 & 107 & 94 & 81 & 68 & 55 \\ 70 & 57 & 44 & 31 & 18 & 5 & 160 & 147 & 134 & 121 & 108 & 95 & 82 & 69 \\ 84 & 71 & 58 & 45 & 32 & 19 & 6 & 161 & 148 & 135 & 122 & 109 & 96 & 83 \\ 98 & 85 & 72 & 59 & 46 & 33 & 20 & 7 & 162 & 149 & 136 & 123 & 110 & 97 \\ 112 & 99 & 86 & 73 & 60 & 47 & 34 & 21 & 8 & 163 & 150 & 137 & 124 & 111 \\ 126 & 113 & 100 & 87 & 74 & 61 & 48 & 35 & 22 & 9 & 164 & 151 & 138 & 125 \\ 140 & 127 & 114 & 101 & 88 & 75 & 62 & 49 & 36 & 23 & 10 & 165 & 152 & 139 \\ 154 & 141 & 128 & 115 & 102 & 89 & 76 & 63 & 50 & 37 & 24 & 11 & 166 & 153 \end{bmatrix}$$

The k-th element is located at $(y_D(k), x_D(k))$ (row, column) in D.

In another embodiment, M and N may be co-prime, and the M*N elements may be filled consecutively using the following formula:

$$x_D(0)=0, y_D(0)=0;$$

$$x_D(i+1)=\text{mod}(x_D+1, N), y_D(i+1)=\text{mod}(y_D(i)+1, M).$$

For example, the diagonal matrix D' generated for M=14 and N=11 is given by:

$$D'(154, 14, 11) = \begin{bmatrix} 0 & 56 & 112 & 14 & 70 & 126 & 28 & 84 & 140 & 42 & 98 \\ 99 & 1 & 57 & 113 & 15 & 71 & 127 & 29 & 85 & 141 & 43 \\ 44 & 100 & 2 & 58 & 114 & 16 & 72 & 128 & 30 & 86 & 142 \\ 143 & 45 & 101 & 3 & 59 & 115 & 17 & 73 & 129 & 31 & 87 \\ 88 & 144 & 46 & 102 & 4 & 60 & 116 & 18 & 74 & 130 & 32 \\ 33 & 89 & 145 & 47 & 103 & 5 & 61 & 117 & 19 & 75 & 131 \\ 132 & 34 & 90 & 146 & 48 & 104 & 6 & 62 & 118 & 20 & 76 \\ 77 & 133 & 35 & 91 & 147 & 49 & 105 & 7 & 63 & 119 & 21 \\ 22 & 78 & 134 & 36 & 92 & 148 & 50 & 106 & 8 & 64 & 120 \\ 121 & 23 & 79 & 135 & 37 & 93 & 149 & 51 & 107 & 9 & 65 \\ 66 & 122 & 24 & 80 & 136 & 38 & 94 & 150 & 52 & 108 & 10 \\ 11 & 67 & 123 & 25 & 81 & 137 & 39 & 95 & 151 & 53 & 109 \\ 110 & 12 & 68 & 124 & 26 & 82 & 138 & 40 & 96 & 152 & 54 \\ 55 & 111 & 13 & 69 & 125 & 27 & 83 & 139 & 41 & 97 & 153 \end{bmatrix};$$

The processor 405 may place 515 the k-th element in the M*N permutation matrix P(M*N, M, N) in the position $(y_P(k), x_P(k))$, where $$y_P(k)=V_{(M, M_d, M_w)}(y_D(k)),$$

$$x_P(k)=V_{(N, N_d, N_w)}(x_D(k)).$$

For example, using the above D(168, 12, 14), the matrix P(168, 12, 14) may be derived this way from D(168, 12, 14) as is given by $$P(168, 12, 14) =$$

$$\begin{bmatrix} 0 & 116 & 64 & 25 & 155 & 103 & 51 & 12 & 142 & 90 & 38 & 167 & 129 & 77 \\ 56 & 4 & 120 & 81 & 43 & 159 & 107 & 68 & 30 & 146 & 94 & 55 & 17 & 133 \\ 112 & 60 & 8 & 137 & 99 & 47 & 163 & 124 & 86 & 34 & 150 & 111 & 73 & 21 \\ 14 & 130 & 78 & 39 & 1 & 117 & 65 & 26 & 156 & 104 & 52 & 13 & 143 & 91 \\ 70 & 18 & 134 & 95 & 57 & 5 & 121 & 82 & 44 & 160 & 108 & 69 & 31 & 147 \\ 129 & 74 & 22 & 151 & 113 & 61 & 9 & 138 & 100 & 48 & 164 & 125 & 87 & 35 \\ 28 & 144 & 92 & 53 & 15 & 131 & 79 & 40 & 2 & 118 & 66 & 27 & 157 & 105 \\ 84 & 32 & 148 & 109 & 71 & 19 & 135 & 96 & 58 & 6 & 122 & 83 & 45 & 161 \\ 140 & 88 & 36 & 165 & 127 & 75 & 23 & 152 & 114 & 62 & 10 & 139 & 101 & 49 \\ 42 & 158 & 106 & 67 & 29 & 145 & 93 & 54 & 16 & 132 & 80 & 41 & 3 & 119 \\ 98 & 46 & 162 & 123 & 85 & 33 & 149 & 110 & 72 & 20 & 136 & 97 & 59 & 7 \\ 154 & 102 & 50 & 11 & 141 & 89 & 37 & 166 & 128 & 76 & 24 & 153 & 115 & 63 \end{bmatrix}.$$

For example, the element "130" may be permutated from the matrix D(168, 12, 14) to the matrix P(168, 12, 14) by first determining the x and y coordinates of the element "130" in the matrix D(168, 12, 14) (with y corresponding to a row number starting with 1 and x corresponding to a column number starting with 1). Specifically, the element "130" has an x coordinate of "5" and a y coordinate of "2." Then, the x coordinate of "5" is applied to the corresponding 1D interleaver (e.g., time domain interleaving vector, permutation vector $V_{(14, 4, 4)}$) to obtain the 5$^{th}$ element of the permutation vector $V_{(14, 4, 4)}$ which is "1." Moreover, the y coordinate of "2" is applied to the corresponding 1D interleaver (e.g., frequency domain interleaving vector, permutation vector $V_{(12, 4, 3)}$) to obtain the 2$^{nd}$ element of the permutation vector $V_{(12, 4, 3)}$ which is "3." These permutated x "1" and y "3" coordinates correspond to a permutated location in the matrix P(168, 12, 14) (with y corresponding to a row number starting with 0 and x corresponding to a column number starting with 0) as shown by the location of the element "130" in the matrix P(168, 12, 14).

In matrix P, two sequential elements (such as "0" and "1") are separated by $M_w$ rows and $N_w$ columns in they and x dimension respectively. Specifically, in P(168, 12, 14), elements "0" and "1" are separated by 3 rows and 4 columns. In certain embodiments, the parameters $M_w$, $N_w$ of the 1D interleavers determine the distance property of the 2D interleaving matrix P. The M*N modulation symbols are mapped 1-to-1 to the M*N elements of the P matrix, therefore the 2D interleaving and mapping scheme is resource conserving (e.g., no resource in the matrix P is wasted). If the two 1D interleavers are some other permutation vectors (not generated with the generation matrix G), the mapping scheme may still be resource conserving, but the frequency and time distance between adjacent modulation symbols may not be guaranteed.

The M by N matrix P may, in certain embodiments, cover all the resource elements 12 allocated to the transmission of the codeword 200. Accordingly, M may be chosen as a number of total available subcarriers 14 in all the PRBs allocated to the mobile device 110. Moreover, N may be chosen as a number of OFDM symbols 10 in a slot 11, a mini-slot 17, or part of a slot 11/mini-slot 17 (such as a subset of OFDM symbols 10) that are allocated to the codeword transmission.

In some embodiments, the parameters used in the 1D interleaver $M_w$, $N_w$ determine the distance in the two dimensions (e.g., time and frequency) between adjacent modulation symbols. As may be appreciated, the PRB is a unit of resource allocation to a data channel and each has 12 subcarriers 14. When more than one PRB is assigned for data transmission, $M_w$, the distance in the frequency domain, may be at least 12 or a multiple of 12. In various embodiments, spreading adjacent modulation symbols in different PRBs may achieve frequency diversity against interference in addition to spreading modulation symbols in one PRBs. In certain embodiments, $N_w$ may determine a distance between adjacent symbols in the time domain. The distance may be $N_w \geq 2$ to at least mitigate single symbol interference. $N_w$ may be set as ceil($\sqrt{N}$). In some embodiments, $M_w$ and $N_w$ may be relatively prime in relationship to each other.

In some embodiments, not all the resource elements 12 in the M subcarriers and N OFDM symbols region may be used for data transmission. For example, some of the resource elements 12 may be used for reference signals or other channels such as PUCCH and/or PDCCH. Another M by N matrix Q may be generated from matrix P by sorting through the elements in the resource elements 12 that are available for data transmission. The following example gives an example of a matrix Q in response to some of the resource elements 12 (marked with −1) not being available for data transmission.

Q gives the mapping of the codeword modulation symbols to the resource elements 12 that are used for data transmission in the time-frequency domain, in the above example, 12 subcarriers by 14 symbols. The interleaving and mapping of Q may also be resource conserving. In certain embodiments, after certain resource elements 12 are marked as not being available for data transmission, the mapping is renumbered so that all resource elements 12 that are available for data transmission are sequential (e.g., numerical order). For example, in matrix Q the element "0" from matrix P (at row 1, column 1 in matrix P) is marked with −1 (at row 1 column 1 in matrix Q) to indicate that that resource element 12 is not available for data transmission. Therefore, the element "1" from matrix P (at row 4, column 5 in matrix P) is renumbered to be element "0" in matrix Q (at row 4, column 5 in matrix Q).

From the 2D mapping of Q, a 3D mapping may be formed. In one 3D interleaving embodiment, the modulation symbols are mapped to the first layer according to the mapping matrix Q until all the available resource elements 12 are used. The remaining symbols are mapped to the next layer following the same mapping pattern, one layer at a time. With this approach, when the above mapping pattern Q is extended to the two-layer case, the first layer $Q_1$ and the second layer $Q_2$ are as follows:

$$Q = \begin{bmatrix} -1 & -1 & -1 & 19 & 113 & 74 & 38 & 9 & 103 & 65 & 29 & 123 & 93 & 57 \\ -1 & -1 & -1 & -1 & -1 & 116 & 77 & 51 & 23 & 106 & 68 & 42 & 13 & 96 \\ -1 & -1 & -1 & 99 & 71 & 35 & 119 & 89 & 62 & 26 & 109 & 80 & 54 & 16 \\ -1 & -1 & -1 & 30 & 0 & 84 & 48 & 20 & 114 & 75 & 39 & 10 & 104 & 66 \\ -1 & -1 & -1 & -1 & -1 & 3 & 87 & 60 & 33 & 117 & 78 & 52 & 24 & 107 \\ -1 & -1 & -1 & 110 & 81 & 45 & 6 & 100 & 72 & 36 & 120 & 90 & 63 & 27 \\ -1 & -1 & -1 & 40 & 11 & 94 & 58 & 31 & 1 & 85 & 49 & 21 & 115 & 76 \\ -1 & -1 & -1 & -1 & -1 & 14 & 97 & 69 & 43 & 4 & 88 & 61 & 34 & 118 \\ -1 & -1 & -1 & 121 & 91 & 55 & 17 & 111 & 82 & 46 & 7 & 101 & 73 & 37 \\ -1 & -1 & -1 & 50 & 22 & 105 & 67 & 41 & 12 & 95 & 59 & 32 & 2 & 86 \\ -1 & -1 & -1 & -1 & -1 & 25 & 108 & 79 & 53 & 15 & 98 & 70 & 44 & 5 \\ -1 & -1 & -1 & 8 & 102 & 64 & 28 & 122 & 92 & 56 & 18 & 112 & 83 & 47 \end{bmatrix};$$

$$Q_1 = \begin{bmatrix} -1 & -1 & -1 & 19 & 113 & 74 & 38 & 9 & 103 & 65 & 29 & 123 & 93 & 57 \\ -1 & -1 & -1 & -1 & -1 & 116 & 77 & 51 & 23 & 106 & 68 & 42 & 13 & 96 \\ -1 & -1 & -1 & 99 & 71 & 35 & 119 & 89 & 62 & 26 & 109 & 80 & 54 & 16 \\ -1 & -1 & -1 & 30 & 0 & 84 & 48 & 20 & 114 & 75 & 39 & 10 & 104 & 66 \\ -1 & -1 & -1 & -1 & -1 & 3 & 87 & 60 & 33 & 117 & 78 & 52 & 24 & 107 \\ -1 & -1 & -1 & 110 & 81 & 45 & 6 & 100 & 72 & 36 & 120 & 90 & 63 & 27 \\ -1 & -1 & -1 & 40 & 11 & 94 & 58 & 31 & 1 & 85 & 49 & 21 & 115 & 76 \\ -1 & -1 & -1 & -1 & -1 & 14 & 97 & 69 & 43 & 4 & 88 & 61 & 34 & 118 \\ -1 & -1 & -1 & 121 & 91 & 55 & 17 & 111 & 82 & 46 & 7 & 101 & 73 & 37 \\ -1 & -1 & -1 & 50 & 22 & 105 & 67 & 41 & 12 & 95 & 59 & 32 & 2 & 86 \\ -1 & -1 & -1 & -1 & -1 & 25 & 108 & 79 & 53 & 15 & 98 & 70 & 44 & 5 \\ -1 & -1 & -1 & 8 & 102 & 64 & 28 & 122 & 92 & 56 & 18 & 112 & 83 & 47 \end{bmatrix};$$

$$Q_2 = \begin{bmatrix} -1 & -1 & -1 & 143 & 237 & 198 & 162 & 133 & 227 & 189 & 153 & 247 & 217 & 181 \\ -1 & -1 & -1 & -1 & -1 & 240 & 201 & 175 & 147 & 230 & 192 & 166 & 137 & 220 \\ -1 & -1 & -1 & 223 & 195 & 159 & 243 & 213 & 186 & 150 & 233 & 204 & 178 & 140 \\ -1 & -1 & -1 & 154 & 124 & 208 & 172 & 144 & 238 & 199 & 163 & 134 & 228 & 190 \\ -1 & -1 & -1 & -1 & -1 & 127 & 211 & 184 & 157 & 241 & 202 & 176 & 148 & 231 \\ -1 & -1 & -1 & 234 & 205 & 169 & 130 & 224 & 196 & 160 & 244 & 214 & 187 & 151 \\ -1 & -1 & -1 & 164 & 135 & 218 & 182 & 155 & 125 & 209 & 173 & 145 & 239 & 200 \\ -1 & -1 & -1 & -1 & -1 & 138 & 221 & 193 & 167 & 128 & 212 & 185 & 158 & 242 \\ -1 & -1 & -1 & 245 & 215 & 179 & 141 & 235 & 206 & 170 & 131 & 225 & 197 & 161 \\ -1 & -1 & -1 & 174 & 146 & 229 & 191 & 165 & 136 & 219 & 183 & 156 & 126 & 210 \\ -1 & -1 & -1 & -1 & -1 & 149 & 232 & 203 & 177 & 139 & 222 & 194 & 168 & 129 \\ -1 & -1 & -1 & 132 & 226 & 188 & 152 & 246 & 216 & 180 & 142 & 236 & 207 & 171 \end{bmatrix};$$

In another 3D interleaving embodiment, at each resource element location in the mapping matrix Q, L consecutive symbols are assigned to the L layers, before moving on the next resource element 12 according to the matrix Q. With this approach, when the above mapping pattern Q is extended to the two-layer case, the first layer $Q_1$ and the second layer $Q_2$ are as follows:

$$Q_1 = \begin{bmatrix} -1 & -1 & -1 & 38 & 226 & 148 & 76 & 18 & 206 & 130 & 58 & 246 & 186 & 114 \\ -1 & -1 & -1 & -1 & -1 & 232 & 154 & 102 & 46 & 212 & 136 & 84 & 26 & 192 \\ -1 & -1 & -1 & 198 & 142 & 70 & 238 & 178 & 124 & 52 & 218 & 160 & 108 & 32 \\ -1 & -1 & -1 & 60 & 0 & 168 & 96 & 40 & 228 & 150 & 78 & 20 & 208 & 132 \\ -1 & -1 & -1 & -1 & -1 & 6 & 174 & 120 & 66 & 234 & 156 & 104 & 48 & 214 \\ -1 & -1 & -1 & 220 & 162 & 090 & 12 & 200 & 144 & 72 & 240 & 180 & 126 & 54 \\ -1 & -1 & -1 & 80 & 22 & 188 & 116 & 62 & 2 & 170 & 98 & 42 & 230 & 152 \\ -1 & -1 & -1 & -1 & -1 & 28 & 194 & 138 & 86 & 8 & 176 & 122 & 68 & 236 \\ -1 & -1 & -1 & 242 & 182 & 110 & 34 & 222 & 164 & 92 & 14 & 202 & 146 & 172 \\ -1 & -1 & -1 & 100 & 44 & 210 & 134 & 82 & 24 & 190 & 118 & 64 & 4 & 172 \\ -1 & -1 & -1 & -1 & -1 & 50 & 216 & 158 & 106 & 30 & 196 & 140 & 88 & 10 \\ -1 & -1 & -1 & 16 & 204 & 128 & 56 & 244 & 184 & 112 & 36 & 224 & 166 & 94 \end{bmatrix};$$

$$Q_2 = \begin{bmatrix} -1 & -1 & -1 & 39 & 227 & 149 & 77 & 19 & 207 & 131 & 59 & 247 & 187 & 115 \\ -1 & -1 & -1 & -1 & -1 & 233 & 155 & 103 & 47 & 213 & 137 & 85 & 27 & 193 \\ -1 & -1 & -1 & 199 & 143 & 71 & 237 & 179 & 125 & 53 & 219 & 161 & 109 & 33 \\ -1 & -1 & -1 & 61 & 1 & 169 & 97 & 41 & 229 & 151 & 79 & 21 & 209 & 133 \\ -1 & -1 & -1 & -1 & -1 & 7 & 175 & 121 & 67 & 235 & 157 & 105 & 49 & 215 \\ -1 & -1 & -1 & 221 & 163 & 91 & 13 & 201 & 145 & 73 & 241 & 181 & 127 & 55 \\ -1 & -1 & -1 & 81 & 23 & 189 & 117 & 63 & 3 & 171 & 99 & 43 & 231 & 153 \\ -1 & -1 & -1 & -1 & -1 & 29 & 195 & 139 & 87 & 9 & 177 & 123 & 69 & 237 \\ -1 & -1 & -1 & 243 & 183 & 111 & 35 & 223 & 165 & 93 & 15 & 203 & 147 & 75 \\ -1 & -1 & -1 & 101 & 45 & 211 & 135 & 83 & 25 & 191 & 119 & 65 & 5 & 173 \\ -1 & -1 & -1 & -1 & -1 & 51 & 217 & 159 & 107 & 31 & 197 & 141 & 89 & 11 \\ -1 & -1 & -1 & 17 & 205 & 129 & 57 & 245 & 185 & 113 & 37 & 225 & 167 & 95 \end{bmatrix};$$

Various embodiments described herein map the codeword 200 with an interleaving scheme to mitigate the impact of a URLLC transmission 18 from a second mobile device 110b to an eMBB transmission from the first mobile device 110a. As a result, a codeword 200 may be transmitted in the eMBB transmission such that the codeword 200 may be recovered even if the URLLC transmission 18 makes a portion of the eMBB transmission unrecoverable.

In various embodiments of the 2D interleaver and mapping pattern described herein, no consecutive modulation symbols may be affected by puncturing or interfering from URLLC transmission 18 occupying up to $M_w$ consecutive subcarriers 14 and $N_w$ OFDM symbols 10. Accordingly, interference from the URLLC transmission 18 may be evened out and enable graceful degradation of the eMBB decoding in the presence of the URLLC transmission 18.

Figure 6:
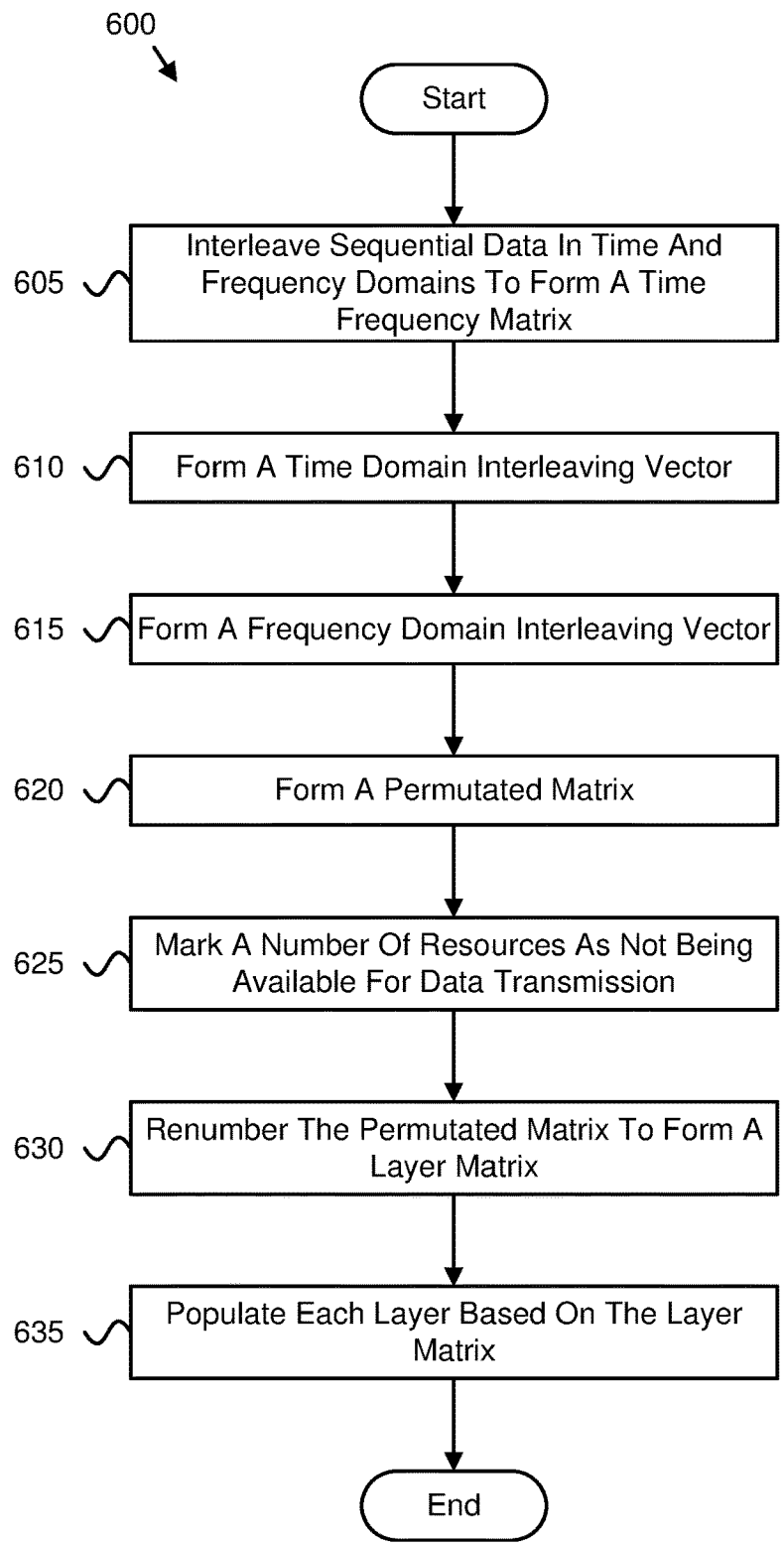
FIG. 6 is a schematic flow chart diagram illustrating another embodiment of a method for interleaving sequential data in time and frequency domains.

FIG. 6 is a schematic flow chart diagram illustrating another embodiment of a method 600 for interleaving sequential data in time and frequency domains. In some embodiments, the method 600 is performed by an apparatus, such as the base station 120 (or the mobile device 110). In certain embodiments, the method 600 may be performed by a processor executing program code, for example, a microcontroller, a microprocessor, a CPU, a GPU, an auxiliary processing unit, a FPGA, or the like.

The method 600 may include interleaving 605 sequential data in time and frequency domains to form a time frequency matrix. In such embodiments, the sequential data includes a first data occupying a first time-frequency resource and a second data occupying a second time-frequency resource, the second data sequentially follows the first data prior to interleaving, and the first data is separated from the second data by at least one time resource and at least one frequency resource after interleaving. In some embodiments, adjacent sequential data before interleaving is separated by at least one time resource and at least one frequency resource after interleaving.

In certain embodiments, the sequential data is interleaved into the time frequency matrix by mapping the sequential data into a first predetermined number of rows and columns in a diagonal manner such that two adjacent elements on a diagonal carry sequential data, and two adjacent elements on a diagonal are separated by one time resource and one frequency resource. In various embodiments, the method 600 includes forming 610 a time domain interleaving vector used for permutating the sequential data in the time domain by mapping time domain indexes into a second predetermined number of rows and columns in a row first manner to form a first mapping matrix and reading out the first mapping matrix in a column first manner.

In some embodiments, the method 600 includes forming 615 a frequency domain interleaving vector used for permutating the sequential data in the frequency domain by mapping frequency domain indexes into a third predetermined number of rows and columns in a row first manner to form a second mapping matrix and reading out the second mapping matrix in a column first manner. In one embodiment, the method 600 includes forming 620 a permutated matrix based on the time frequency matrix. In such embodiments, each location of the time frequency matrix is permutated in the time domain based on the time domain interleaving vector and in the frequency domain based on the frequency domain interleaving vector to result in a corresponding permutated location, and the sequential data in each location is moved to the corresponding permutated location to form the permutated matrix. In a further embodiment, the method 600 includes marking 625 a number of resources as not being available for data transmission as part of the mapping of the sequential data. In certain embodiments, the method 600 includes renumbering 630 the permutated matrix based on the number of resources that are marked as not being available for data transmission to form a layer matrix.

In various embodiments, the method 600 includes populating 635 each layer with the sequential data based on the layer matrix. In certain embodiments, each layer is populated with the sequential data based on the layer matrix such that an entire layer is populated before moving to a next layer. In some embodiments, each layer is populated with the sequential data based on the layer matrix such that a same time-frequency resource of each layer is populated before moving to a next time-frequency resource. In one embodiment, the method 600 includes transmitting the sequential data that is interleaved in the time and frequency domains.

Figure 7:
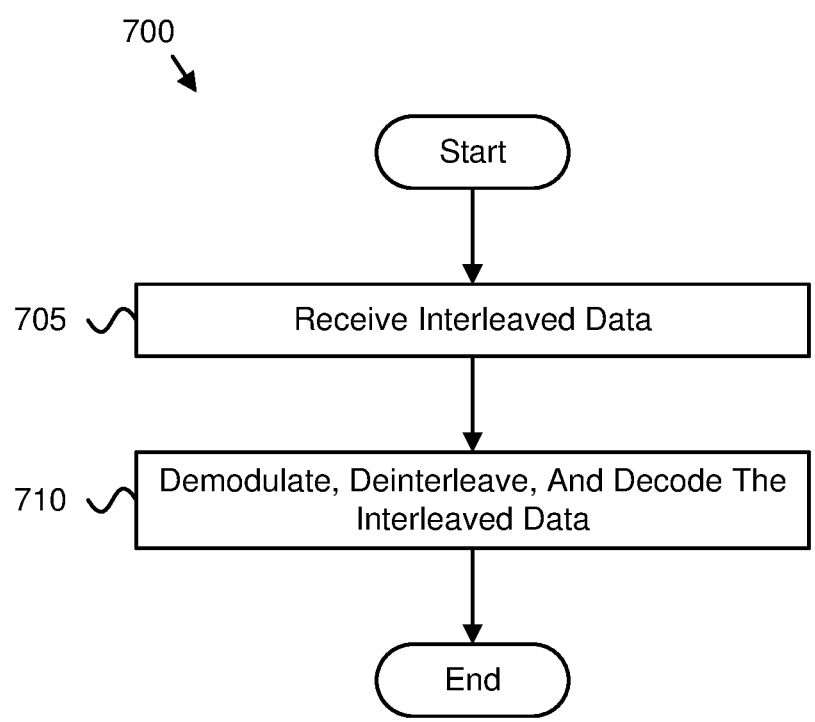
FIG. 7 is a schematic flow chart diagram illustrating one embodiment of a method for receiving interleaved sequential data.

FIG. 7 is a schematic flow chart diagram illustrating one embodiment of a method 700 for receiving interleaved sequential data. In some embodiments, the method 700 is performed by an apparatus, such as the mobile device 110 (or the base station 120). In certain embodiments, the method 700 may be performed by a processor executing program code, for example, a microcontroller, a microprocessor, a CPU, a GPU, an auxiliary processing unit, a FPGA, or the like.

The method 700 may include receiving 705 interleaved sequential data. The method 700 may also include demodulating 710, deinterleaving, and decoding the interleaved sequential data. In such an embodiment, the interleaved sequential data is deinterleaved in substantially a reverse manner described in relation to method 600. In such an embodiment, the interleaved sequential data is deinterleaved in time and frequency domains, the sequential data includes a first data occupying a first time-frequency resource and a second data occupying a second time-frequency resource, the second data sequentially follows the first data after deinterleaving, and the first data is separated from the second data by at least one time resource and at least one frequency resource before deinterleaving.

In one embodiment, adjacent sequential data after deinterleaving is separated by at least one time resource and at least one frequency resource before deinterleaving. In certain embodiments, the sequential data is interleaved into a time frequency matrix by mapping the sequential data into a first predetermined number of rows and columns in a diagonal manner such that two adjacent elements on a diagonal carry sequential data, and two adjacent elements on a diagonal are separated by one time resource and one frequency resource. In various embodiments, a time domain interleaving vector used for permutating the sequential data in the time domain is formed by mapping time domain indexes into a second predetermined number of rows and columns in a row first manner to form a first mapping matrix and reading out the first mapping matrix in a column first manner.

In some embodiments, a frequency domain interleaving vector used for permutating the sequential data in the frequency domain is formed by mapping frequency domain indexes into a third predetermined number of rows and columns in a row first manner to form a second mapping matrix and reading out the second mapping matrix in a column first manner. In one embodiment, a permutated matrix is formed based on the time frequency matrix. In such embodiments, each location of the time frequency matrix is permutated in the time domain based on the time domain interleaving vector and in the frequency domain based on the frequency domain interleaving vector to result in a corresponding permutated location, and the sequential data in each location is moved to the corresponding permutated location to form the permutated matrix. In a further embodiment, the mapping of the sequential data includes a number of resources that are marked as not being available for data transmission. In certain embodiments, the permutated matrix is renumbered based on the number of resources that are marked as not being available for data transmission to form a layer matrix.

In various embodiments, each layer is populated with the sequential data based on the layer matrix such that an entire layer is populated before moving to a next layer. In some embodiments, each layer is populated with the sequential data based on the layer matrix such that a same time-frequency resource of each layer is populated before moving to a next time-frequency resource.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
   interleaving sequential data in time and frequency domains, wherein:

the sequential data comprises a first data occupying a first time-frequency resource and a second data occupying a second time-frequency resource;

the second data sequentially follows the first data prior to interleaving;

the first data is separated from the second data by at least one time resource and at least one frequency resource after interleaving;

the sequential data is interleaved into a time frequency matrix by mapping the sequential data into a first predetermined number of rows and columns in a diagonal manner such that two adjacent elements on a diagonal carry sequential data; and two adjacent elements on a diagonal are separated by one time resource and one frequency resource.

2. The method of claim 1, further comprising transmitting the sequential data that is interleaved in the time and frequency domains.

3. The method of claim 1, wherein a time domain interleaving vector used for permutating the sequential data in the time domain is formed by mapping time domain indexes into a second predetermined number of rows and columns in a row first manner to form a first mapping matrix and reading out the first mapping matrix in a column first manner.

4. The method of claim 3, wherein a frequency domain interleaving vector used for permutating the sequential data in the frequency domain is formed by mapping frequency domain indexes into a third predetermined number of rows and columns in a row first manner to form a second mapping matrix and reading out the second mapping matrix in a column first manner.

5. The method of claim 4, further comprising forming a permutated matrix based on the time frequency matrix, wherein each location of the time frequency matrix is permutated in the time domain based on the time domain interleaving vector and in the frequency domain based on the frequency domain interleaving vector to result in a corresponding permutated location, and the sequential data in each location is moved to the corresponding permutated location to form the permutated matrix.

6. The method of claim 5, wherein the mapping of the sequential data comprises a number of resources that are marked as not being available for data transmission.

7. The method of claim 6, wherein the permutated matrix is renumbered based on the number of resources that are marked as not being available for data transmission to form a layer matrix.

8. The method of claim 7, wherein each layer is populated with the sequential data based on the layer matrix such that an entire layer is populated before moving to a next layer.

9. The method of claim 7, wherein each layer is populated with the sequential data based on the layer matrix such that a same time-frequency resource of each layer is populated before moving to a next time-frequency resource.

10. An apparatus comprising:
    a processor that interleaves sequential data in time and frequency domains, wherein:

the sequential data comprises a first data occupying a first time-frequency resource and a second data occupying a second time-frequency resource;

the second data sequentially follows the first data prior to interleaving;

the first data is separated from the second data by at least one time resource and at least one frequency resource after interleaving;

the sequential data is interleaved into a time frequency matrix by mapping the sequential data into a first predetermined number of rows and columns in a diagonal manner such that two adjacent elements on a diagonal carry sequential data; and two adjacent elements on a diagonal are separated by one time resource and one frequency resource.

11. The apparatus of claim 10, further comprising a transmitter that transmits the sequential data that is interleaved in the time and frequency domains.

12. An apparatus comprising:

a receiver that receives interleaved sequential data; and a processor that demodulates, deinterleaves, and decodes the interleaved sequential data, wherein:

the interleaved sequential data is deinterleaved in time and frequency domains;

the sequential data comprises a first data occupying a first time-frequency resource and a second data occupying a second time-frequency resources;

the second data sequentially follows the first data after deinterleaving;

the first data is separated from the second data by at least one time resource and at least one frequency resource before deinterleaving;

the sequential data is interleaved into a time frequency matrix by mapping the sequential data into a first predetermined number of rows and columns in a diagonal manner such that two adjacent elements on a diagonal carry sequential data; and two adjacent elements on a diagonal are separated by one time resource and one frequency resource.

13. The apparatus of claim 12, wherein a time domain interleaving vector used for permutating the sequential data in the time domain is formed by mapping time domain indexes into a second predetermined number of rows and columns in a row first manner to form a first mapping matrix and reading out the first mapping matrix in a column first manner.

14. The apparatus of claim 13, wherein a frequency domain interleaving vector used for permutating the sequential data in the frequency domain is formed by mapping frequency domain indexes into a third predetermined number of rows and columns in a row first manner to form a second mapping matrix and reading out the second mapping matrix in a column first manner.

15. The apparatus of claim 14, wherein a permutated matrix is formed based on the time frequency matrix, each location of the time frequency matrix is permutated in the time domain based on the time domain interleaving vector and in the frequency domain based on the frequency domain interleaving vector to result in a corresponding permutated location, and the sequential data in each location is moved to the corresponding permutated location to form the permutated matrix.

16. The apparatus of claim 15, wherein the mapping of the sequential data comprises a number of resources that are marked as not being available for data transmission.

17. The apparatus of claim 16, wherein the permutated matrix is renumbered based on the number of resources that are marked as not being available for data transmission to form a layer matrix.

* * * * *